United States Patent [19]

Iwasaki et al.

[11] Patent Number: 4,648,095
[45] Date of Patent: Mar. 3, 1987

[54] SEMICONDUCTOR LASER

[75] Inventors: Tamotsu Iwasaki, Tokyo; Toshiaki Ikoma, 6-4-16, Honkomagome, Bunkyo-ku, Tokyo; Tsugunori Okumura, 21-8-104, Mitsuzawashimocho, Kanagawa-ku, Yokohama-shi, all of Japan

[73] Assignees: Furukawa Electric Co., Ltd.; Toshiaki Ikoma; Tsugunori Okumura, all of Tokyo, Japan

[21] Appl. No.: 633,971

[22] Filed: Jul. 24, 1984

[30] Foreign Application Priority Data

Aug. 2, 1983 [JP] Japan ................................ 58-140606

[51] Int. Cl.4 ................................................ H01S 3/19
[52] U.S. Cl. ........................................ 372/44; 357/17; 372/49
[58] Field of Search ................ 372/49, 43, 44; 357/17

[56] References Cited

U.S. PATENT DOCUMENTS 4,563,368 1/1986 Tihanyi et al. ...................... 372/49

OTHER PUBLICATIONS

J. C. Dyment et al, "Top and Side Emission from Double Heterostructure LED's and Lasers", *IEEE Transactions on Electron Devices*, vol. ED-24, No. 7, Jul. 1977, pp. 995-1000.

Primary Examiner—James W. Davie
Attorney, Agent, or Firm—Frishauf, Holtz, Goodman & Woodward

[57] ABSTRACT

Solid phase reaction products are employed as reflecting planes of a semiconductor laser facing each other with an active layer in between, which significantly improve its performance and productivity.

10 Claims, 20 Drawing Figures

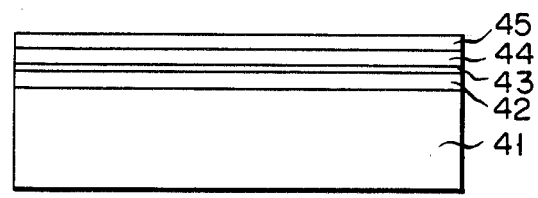
F I G. 4A
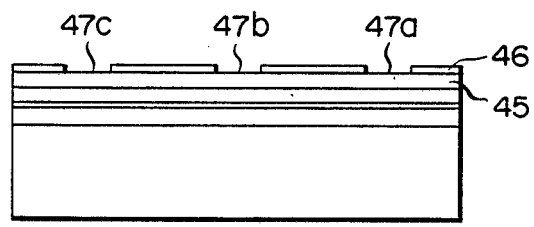
F I G. 4B
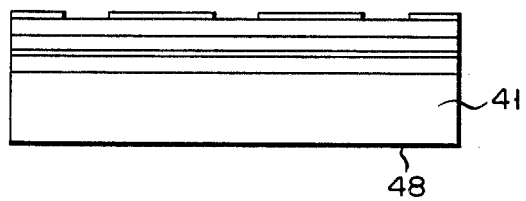
F I G. 4C
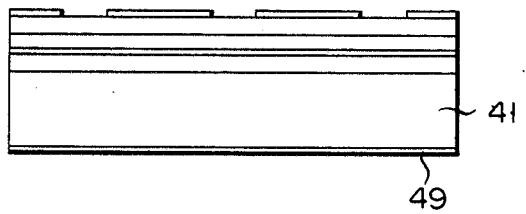
F I G. 4D
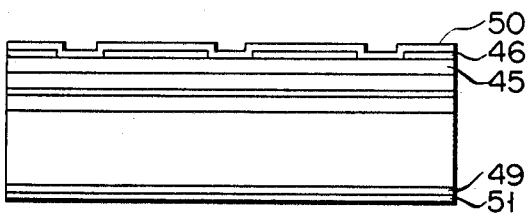
F I G. 4E

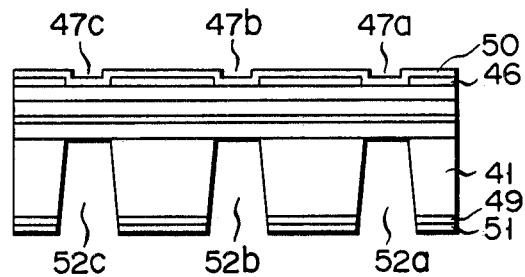
FIG. 4F
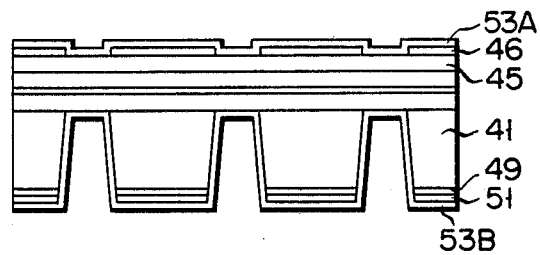
FIG. 4G
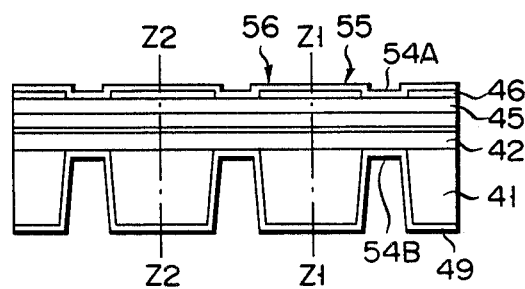
FIG. 4H
FIG. 4I   FIG. 5
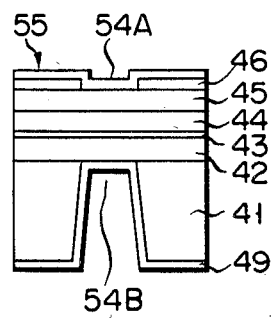 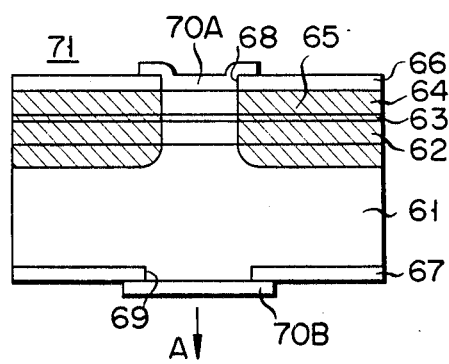

SEMICONDUCTOR LASER

BACKGROUND OF THE INVENTION

The present invention relates to a semiconductor laser having an improved resonator reflecting plane.

A conventional semiconductor laser having a double heterojunction structure is known to have a low operation current density, long life, and good emission characteristics. Therefore, such a semiconductor laser is used as a key device in optoelectronic industries such as communications and computers. In order to widen the application scope of the semiconductor laser, problems such as an improvement in a laser output, lower cost, or the like must still be resolved.

A conventional double heterostructure semiconductor laser comprises a three-layered structure in which an active layer formed of III-V compound semiconductor such as gallium arsenide (GaAs) is sandwiched between two GaAlAs layers. This three-layered structure is further sandwiched between positive and negative electrodes. In a resonator of a semiconductor laser having such a structure, two reflecting planes or mirrors are obtained by cleaving a double heterostructure wafer. They are perpendicular to a junction plane. Since these cleaved surfaces are significantly smooth, they can be used as the reflecting planes of the resonator.

In such a structure, when a forward-bias DC voltage is applied between the positive and negative electrodes, minority carriers are injected into a GaAs active layer where light emission takes place. Since a refractive index of the GaAs active layer is higher than that of the GaAlAs layers formed on the upper and lower surfaces thereof, emitted light is confined to the active layer and is repeatedly reflected between two opposite reflecting planes, thereby causing laser emission. Part of the laser light is externally emitted through the reflecting planes.

In a conventional semiconductor laser, the cleavage process is responsible for low-reproducibility and poor yield because of its difficulty to obtain good reflecting planes and a pre-designed laser cavity. Furthermore, the cleaved surface has a low reflectance of about 30%, thereby preventing an improvement in the output of a semiconductor laser. This is because low reflectance decreases optical feedback gain.

Meanwhile, in the manufacturing of a surface emitting semiconductor laser, a method of forming reflecting planes utilizing a combination of epitaxial growth and chemical etching in place of cleaving has been proposed. In such a laser the reflectance of the obtained reflecting plane is as low as 15%, too low for practical use. Furthermore, in the surface emitting semiconductor laser, the cavity length of the resonator is very short, e.g., about 10 μm. Therefore, if the positions of the reflecting planes cannot be controlled with high precision, on the order of several tens of angstroms, mass production of the surface emitting semiconductor lasers cannot be performed. No available method which satisfies these conditions has been developed.

SUMMARY OF THE INVENTION

It is an object of the present invention to provide a high-output, low-cost semiconductor laser which can be mass-produced.

In order to achieve this object, solid phase reaction products are utilized for reflecting planes of a Fabry-Perot resonator in a semiconductor laser having an active layer of a III-V compound semiconductor. They are the products of one or both of the III- and V-group elements of the III-V compound semiconductor with a transition metal capable of forming a compound having a stoichiometric composition.

BRIEF DESCRIPTION OF THE DRAWINGS

FIGS. 4A to 4I are views showing a fabrication process of a surface emitting semiconductor laser of another embodiment of the present invention; and FIG. 5 is a sectional view of a surface emitting semiconductor laser of still another embodiment of the present invention.

DETAILED DESCRIPTION OF THE PREFERRED EMBODIMENTS

Prior to the description of an embodiment of the present invention, a solid phase reaction product which is formed between a III-V compound semiconductor and a metal will be explained.

Figure 1A:
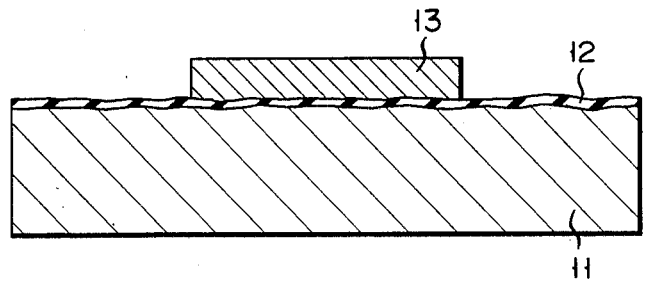
FIGS. 1A to 1C are views showing a process of forming a solid phase reaction product of a III-V compound semiconductor with a metal.

In FIG. 1A, the actual surface of a layer 11 of a III-V compound semiconductor such as GaAs is usually covered with a mechanically damaged layer with native oxide 12 after being polished and etched chemically. A transition metal layer 13 is deposited on the mechanically damaged layer 12 by vacuum deposition, sputtering, or the like. The metal layer 13 is formed of one, or more than two metals of, e.g., Ni, Pd and Pt, each of which reacts with one or both of the III- and V-group elements to produce a compound which has a stoichiometric composition. In this case, transition metals such as Ti, Fe, Co, Ni, Rh, Pd, W, Os, Ir, Pt, or lanthanide series metals can be used. In particular, Pt, Pd and Ni are preferable.

Figure 1B:
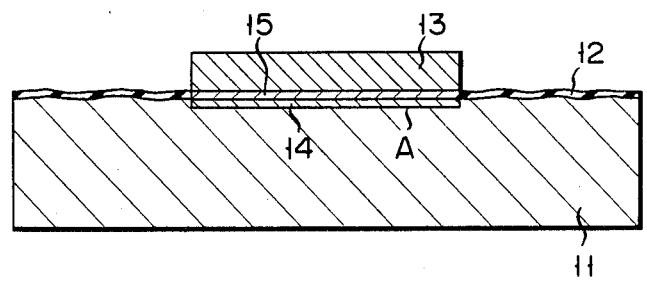
Figure 1C:
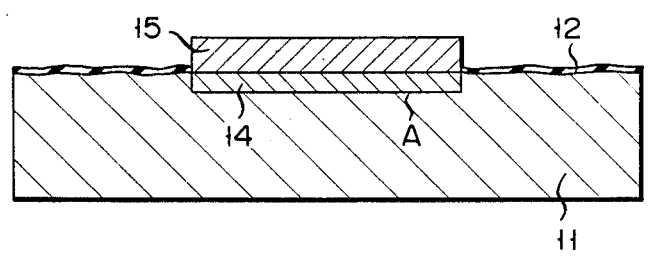

Then, the GaAs layer 11, which is in the state shown in FIG. 1A, is heated. In this case, the heating temperature is set low, e.g., 250° C. to 450° C., so as not to thermally modify the layer 11. As a result, a solid phase reaction gradually occurs between the GaAs layer 11 and a metal layer, e.g., the Pt layer 13. FIG. 1B shows the solid phase reaction. An As-Pt compound 14 is formed in a portion in the vicinity of the junction plane between the GaAs layer 11 and the Pt layer 13. On the other hand, a Ga-Pt compound 15 is formed at the side of the Pt layer 13. This reaction progresses through the mechanically damaged layer 12 until the Pt layer is completely converted to the solid phase reaction products 14 and 15, as shown in FIG. 1C. This reaction also progresses to expose the low index plane of the GaAs layer 11 having, e.g., (1,0,0) crystal plane. The mechanism of this reaction is assumed to be that the solid phase reaction for forming the As-Pt compound 14 rapidly progresses in the direction along an interface A therebetween, but slowly progresses in the direction perpendicular to the interface A. Therefore, the interface A of the solid phase reaction product 14 in contact with the GaAs layer 11 becomes considerably smooth.

The smoothness is determined on the order of several tens of angstroms.

Since the solid phase reaction product 14 has optical properties similar to those of metals, the reflectance of light at the interface A with the GaAs layer 11 becomes around 60% or more. This significantly improves the resonator characteristics of a semiconductor laser.

Figure 2:
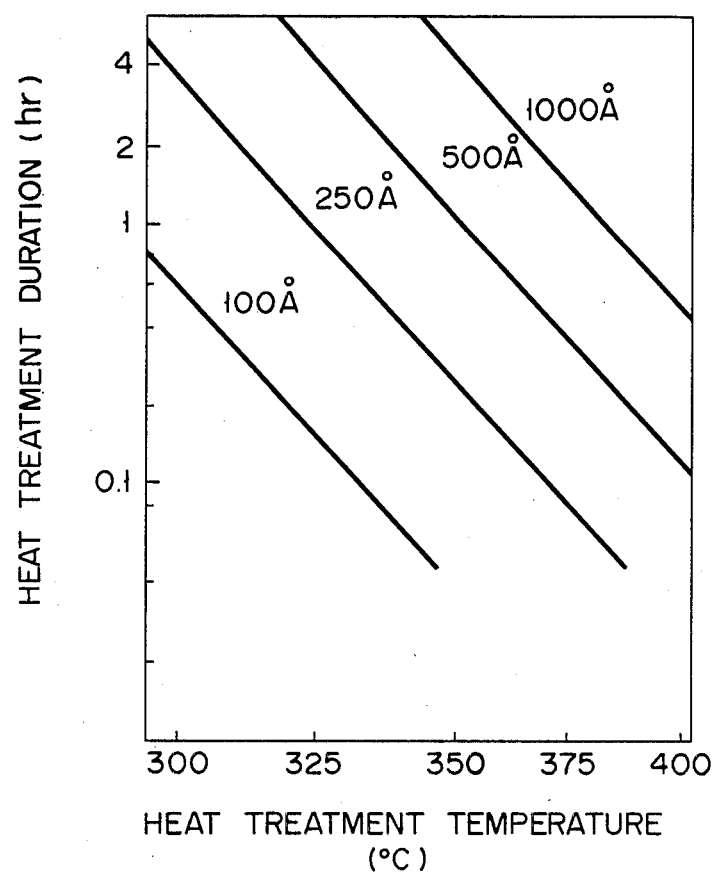
FIG. 2 is a graph showing a relationship between the duration of the heat treatment and its temperature to obtain a desired depth of an interface between GaAs and the solid phase reaction product.

Furthermore, the position of the interface A shown in FIGS. 1B and 1C can be precisely controlled. FIG. 2 is a graph showing a relationship between the duration of the heat treatment (hr) and its temperature (°C.), which is necessary for forming the interface A at a position of a predetermined depth from a surface of the GaAs layer 11 by solid phase reaction after depositing the Pt layer 13 of a predetermined thickness of the GaAs layer 11. As is apparent from this graph, the position of the interface A can be precisely controlled with an error on the order of 10 Å by controlling the duration of the heat treatment and its temperature. Note that the position of the interface A depends on the kind of metal initially deposited, deposition thickness, and the compound semiconductor. In any case, once such a relationship is obtained, the position can be determined with high precision by controlling the duration of the heat treatment and its temperature.

The fabrication process of the laser according to the embodiment of the present invention will now be described with reference to FIGS. 3A to 3F.

Figure 3A:
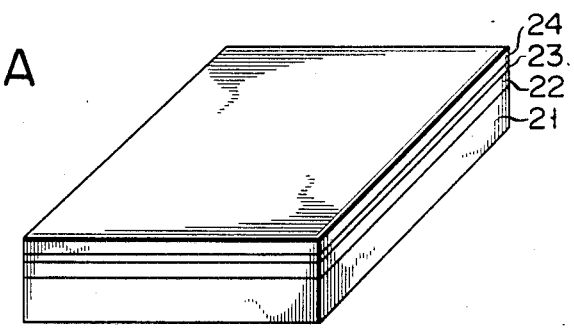
FIGS. 3A to 3F are perspective views showing a fabrication process of a semiconductor laser of an embodiment of the present invention.

As shown in FIG. 3A, an n-type GaAlAs layer 22, an n-type GaAs active layer 23, and a GaAlAs layer 24 are sequentially grown on a surface of an n-type GaAs substrate 21 by an epitaxial technique such as liquid phase epitaxy.

Figure 3B:
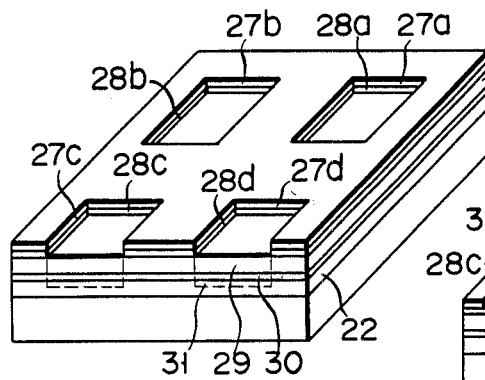

As shown in FIG. 3B, an $SiO_2$ insulating film 25 is formed on the n-type GaAlAs layer 24. Then, a photoresist film 26 is formed on the $SiO_2$ film 25. In this case, the photoresist film 26 is etched in a grid pattern by a conventional photoetching technique to form a plurality of windows 27a, 27b, 27c, 27d... therein. The $SiO_2$ film 25 is etched through the windows 27a, 27b, 27c... to form a plurality of corresponding openings 28a, 28b, 28c... Then, the photoresist film 26 is removed. Thereafter, Zn is diffused to a predetermined depth in a semiconductor crystal, i.e., the GaAlAs layer 24, the n-type GaAs active layer 23 and the n-type GaAlAs layer 22 through the openings 28a, 28b, 28c... of the $SiO_2$ film 25, thereby forming p-type layers 29, 30 and 31 in the respective layers. In FIG. 3B, Zn-diffused portions are indicated by the broken lines.

Figure 3C:
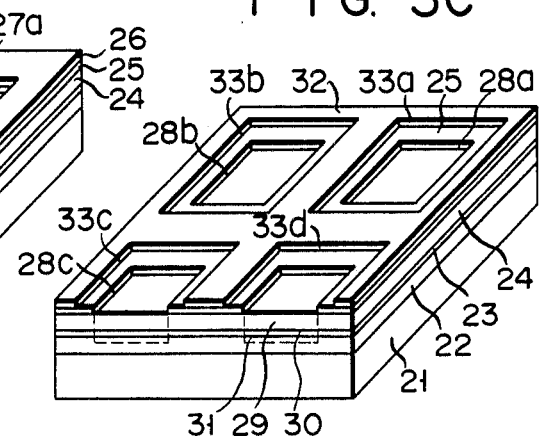
Figure 3D:
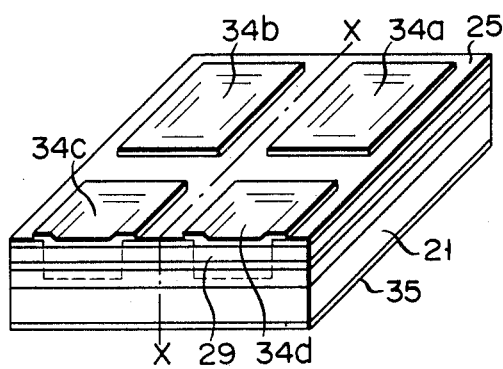

The entire surface of the $SiO_2$ film 25 and the surface portion of the GaAlAs layer 24 exposed through the openings 28a, 28b, 28c... are covered by a photoresist film 32. Then, the photoresist film 32 is etched to form windows 33a, 33b, 33c... larger than the openings 28a, 28b, 28c... therein, as shown in FIG. 3C. Subsequently, Au-Zn layers 34a, 34b, 34c... are deposited in the windows 33a, 33b, 33c..., and thereafter the photoresist film 32 is removed. Then, the structure in which the openings 28a, 28b, 28c... of the $SiO_2$ film 25 are filled with the Au-Zn layers 34a, 34b, 34c... can be obtained, as shown in FIG. 3D. The Au-Zn layers 34a, 34b, 34c... are alloyed to serve as electrodes on the p-type layer 29.

Meanwhile, the lower surface of the n-type GaAs substrate 21 is polished to a desired thickness. Thereafter, an Au-Ge-Ni layer 35 is deposited on the entire lower surface of the substrate 21. The Au-Ge-Ni layer is alloyed by heat treatment to be formed as an electrode.

Figure 3E:
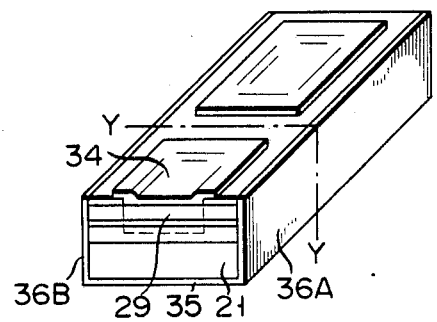

The semi-finished product shown in FIG. 3D is entirely covered by a photoresist film (not shown) and is then cut by a dicing machine along the line X—X of FIG. 3D. This cut surface is processed by chemical etching to remove processing strain. Thereafter, Pt layers 36A and 36B are respectively deposited to a predetermined thickness on the opposite etched surfaces, as shown in FIG. 3E. These Pt films 36A and 36B are deposited as follows. A semi-finished product as shown in FIG. 3E is placed in a vacuum of about $10^{-7}$ Torr and is processed by evaporation using an electron gun. After deposition of the Pt films 36A and 36B, the solid phase reaction is started at a temperature of 400° C. for 20 minutes to convert the Pt films 36A and 36B into the same kind of solid phase reaction products as those described with reference to FIGS. 1A to 1C.

Figure 3F:
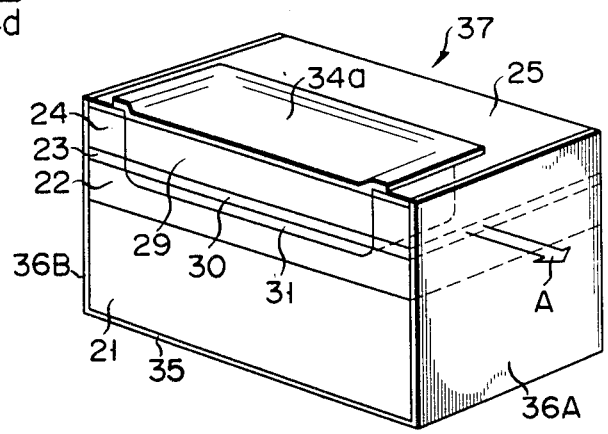

Then, the resultant structure is cut by a dicing machine along the line Y—Y of FIG. 3E. The cut surface is processed by chemical etching to finally obtain a semiconductor laser 37 as shown in FIG. 3F. The semiconductor laser 37 is a modification of a so-called transverse junction stripe laser. When a forward-bias voltage is applied between the positive electrode 34a and the negative electrode 35 from a DC power supply, a current flows from the positive electrode 34a to the negative electrode 35 through the Zn-diffused p-type layers 29, 30 and 31. Since the band gap of the n-type layer 23 (i.e., GaAs active layer) is narrower then that of the GaAlAs layer 24, the current mainly flows into the n-type GaAs layer 23, thereby confining a minority carrier in the vicinity of the interface between the n-type GaAs layer 23 and the Zn-diffused p-type GaAs layer 30. The laser light emerges in the direction indicated by the arrow A.

In this manner, the semiconductor laser 37 of this embodiment is fabricated such that after a semiconductor crystal having a double heterojunction structure is precisely cut by a dicing machine and processing strain is removed by chemical etching, deposition of a metal such as Pt or the like on the etched surfaces by vacuum deposition or sputtering, and heat-treatment of the deposited films are subsequently performed to form solid phase reaction products. The cutting process of the semiconductor crystals by a dicing machine or a chemical etching process is extremely simple, and a solid phase reaction product can be obtained by simple heat-treatment, therefore improving manufacturing quality control. Thus, a semiconductor laser with such a structure has high reproducibility and yield when compared to that of a conventional semiconductor laser which uses a cleaved surface. Furthermore, the reflectance is high, thereby producing a semiconductor laser with low threshold current density.

The embodiment described above exemplifies a semiconductor laser of a double heterostructure using GaAs and GaAlAs, which is preferable in mass production. The present invention can be employed in any semiconductor laser which has an active layer of, e.g., InGaAs, GaAsSb, InGaAsP, or the like and which has reflecting planes along a direction perpendicular to the active layer.

FIGS. 4A to 4I show the fabrication process of an embodiment of a surface emitting semiconductor laser in which the present invention is most usefully employed. In the surface emitting semiconductor laser, reflecting planes of a resonator are arranged to be parallel to an active layer.

As shown in FIG. 4A, an n-type GaAlAs layer 42, a GaAs active layer 43, a p-type GaAlAs layer 44 and a $p^+$-type contact layer 45 are sequentially grown on an n-type GaAs substrate 41 by the epitaxial technique, e.g., liquid-phase epitaxy. An $SiO_2$ insulating film 46 is formed on the entire surface of the $p^+$-type contact layer 45. As shown in FIG. 4B, a plurality of circular openings 47a, 47b, 47c . . . is formed in the $SiO_2$ film 46 by etching. Subsequently, as shown in FIG. 4C, the lower surface of the GaAs substrate is polished to a predetermined thickness so as to form a mirror surface 48. An Au-Ge-Ni film is deposited on the mirror surface 48 and is alloyed to form an electrode 49, as shown in FIG. 4D.

As shown in FIG. 4E, photoresist films 50 and 51 are deposited on the upper and lower surfaces of the resultant structure. In the photoresist film 51, circular openings 52a, 52b, 52c . . . are formed corresponding to the positions of the circular openings 47a, 47b, 47c, . . . formed in the upper surface of the resultant structure. Exposed portions of the electrode 49 in the openings 52a, 52b, 52c . . . and portions of the GaAs substrate 41 formed on the corresponding exposed portions of the electrode 49 are etched to be completely removed, as shown in FIG. 4F. In this case, the centers of the circular openings 52a, 52b, 52c . . . preferably coincide with those of the corresponding circular openings 47a, 47b, 47c . . . The photoresist film 50 formed on the upper surface of the resultant structure is removed. Thereafter, Pt layers 53A and 53B are respectively formed on the entire upper and lower surfaces of the resultant structure by vacuum deposition or sputtering.

Then, the Pt layer 53B and the photoresist film 51 formed on the lower surface of the resultant structure are removed. A solid phase reaction is performed at a temperature of 400° C. for 10 minutes, to form, as shown in FIG. 4H, solid phase reaction products 54A and 54B in contact with the p-type GaAs layer 45 and the n-type GaAlAs layer 42, respectively. Interfaces between the solid phase reaction products 54A and 54B and the layers 45 and 42 respectively serve as reflecting planes of a Fabry-Perot resonator. Since laser light is extracted, for example, in a vertical direction through the solid phase reaction product 54B, the Pt layer 53B must be formed to be sufficiently thin, or a portion of it must be removed after forming the product 54B of the solid phase reaction.

Finally, a surface emitting semiconductor laser 55 can be obtained by cutting the resultant structure along the lines Z1—Z1 and Z2—Z2.

In this embodiment of FIG. 4I, the solid phase reaction product 54A formed by the $p^+$-type contact layer 45 and the overlying Pt layer 53A serves not only as a reflecting plane of a resonator, but also as a positive electrode. In order words, the solid phase reaction product 54A can provide a more satisfactory ohmic contact with the p-type GaAs layer 45 than a conventional electrode material because of the so-called snowplow effect.

The surface emitting semiconductor laser 55 of the embodiment of FIG. 4I performs laser emission at 77° K. and has a peak wavelengh of 856 nm. The solid phase reaction is performed with respect to another cut semiconductor laser 56 of FIG. 4H at 400° C. for 17 minutes. As a result, the laser wavelength is converted to 854 nm. In this manner, it is confirmed that the laser wavelength can be precisely controlled by changing the depth of the interface, hence by changing the reaction duration. The control of the laser wavelength can be performed not only by altering the duration of the heat-treatment, but also by controlling the thickness of the deposited Pt layer or the heat-treatment temperature.

FIG. 5 shows still another embodiment of the present invention. This embodiment is employed in an InGaAsP/InP surface emitting semiconductor laser. First, an n-type InP layer 62, an InGaAsP active layer 63, and an n-type InP layer 64 are sequentially grown on an InP substrate 61 by an epitaxial technique. Zn is diffused into the resultant epitaxial wafer except for its central portion to form a ring-shaped p-type region 65 is a hatched portion. In this case, carriers are injected into the active layer 63 in the transverse direction to prevent diversion of the carrier flow out of a cavity region. Then, an In-Zn alloy film 66 and an Au-Ge-Ni alloy film 67 are respectively provided on the upper and lower surfaces of the resultant structure. Furthermore, windows 68 and 69 are respectively formed in the upper and lower surfaces of the central portion of the resultant structure. Then, Pt layers are formed to fill the windows 68 and 69 by vacuum deposition or sputtering. A solid phase reaction process for the Pt layers is performed at a temperature of 380° C. for 15 minutes, whereby the Pt layers are converted to solid phase reaction products 70A and 70B. Reflecting planes of a resonator are respectively provided on interfaces between the solid phase reaction products and InP layer 64 and the InP substrate 61.

In a semiconductor laser 71 with a structure as that of FIG. 5, since the InP substrate 61 does not absorb a laser beam emitted from the active layer 63, the emitted laser beam passes through the solid phase reaction product of the lower surface of the semiconductor laser 71. Then, the laser beam is extracted in the direction indicated by arrow A. In a semiconductor laser practically fabricated in the above manner, laser emission occurred at 77° K. and the peak wavelength thereof was 1,153 nm.

In the embodiments described above, although the reflecting planes of a Fabry-Perot resonator consist of solid phase reaction products, one reflecting plane may be formed by the solid phase reaction product and the other reflecting plane may be provided by, for example, a metal deposited on the polished lower surface of the substrate 61. The solid phase reaction product can be formed not only in GaAs or InP, but in other III-V compound semiconductors. Therefore, this fabrication method can be widely employed in various semiconductor lasers with a double heterostructure or a multiple quantum well structure.

While in the described embodiments the reflecting planes are arranged perpendicular to or parallel with the active layer, this invention is also applicable to a case wherein the reflecting planes are arranged substantially perpendicular to or substantially parallel with the active layer.

In this manner, the semiconductor laser of the present invention has excellent reflecting planes and a laser wavelength of high precision because reflecting planes are formed by solid phase reaction products which can be precisely controlled as to their position. Therefore, the present invention considerably improves laser production.

What is claimed is:

1. In a semiconductor laser comprising a III-V compound semiconductor and reflecting planes facing each other with an active layer of a heterostructure in between the facing reflecting planes, the improvement comprising:

an interface, acting as at least one of said reflecting planes, and which is formed between a solid phase reaction product and said III-V compound semiconductor, said solid phase reaction product being of at least one element of said III-V compound semiconductor and a transition metal which, reacting with said element, produces a stoichiometric compound formed on said III-V compound semiconductor.

2. A semiconductor laser according to claim 1, wherein said III-V compound semiconductor of the heterostructure includes a plurality of epitaxial layers.

3. A semiconductor laser according to claim 2, wherein said heterostructure has an end surface, and said solid phase reaction product formed on said end surface of said heterostructure in a direction to cross a plane of said active layer.

4. A semiconductor laser according to claim 2, wherein said solid phase reaction product is formed on an outside plane of one of said plurality of epitaxial layers and is arranged substantially in parallel with said active layer.

5. A semiconductor laser according to claim 2, wherein said solid phase reaction product is formed on the outside of a substrate of said heterostructure and is arranged substantially in parallel with said active layer.

6. A semiconductor laser according to claim 2, wherein said transition metal is at least one selected from the group consisting of titanium, iron, cobalt, nickel, rhodium, palladium, tungsten, osmium, iridium, platinum, and lanthanide series metals.

7. A semiconductor laser according to claim 2, wherein said transition metal is one selected from the group consisting of platinum, palladium, and nickel.

8. A semiconductor laser according to claim 2, wherein said transition metal is platinum.

9. A semiconductor laser according to claim 2, wherein said transition metal is palladium.

10. A semiconductor laser according to claim 2, wherein said transition metal is nickel.

* * * * *

UNITED STATES PATENT AND TRADEMARK OFFICE
CERTIFICATE OF CORRECTION

PATENT NO.   : 4,648,095
DATED        : March 3, 1987
INVENTOR(S)  : IWASAKI et al It is certified that error appears in the above-identified patent and that said Letters Patent is hereby corrected as shown below:

On the title, the assignee data should read as follows:

-- The Furukawa Electric Co., Ltd. of Tokyo, JAPAN;

Toshiaki Ikoma of Tokyo, JAPAN;

Tsugunori Okumura of Yokohama, JAPAN --.

Signed and Sealed this

Twelfth Day of January, 1988

*Attest:*

DONALD J. QUIGG

*Attesting Officer*  *Commissioner of Patents and Trademarks*